United States Patent
Chang et al.

(10) Patent No.: US 10,504,847 B2
(45) Date of Patent: Dec. 10, 2019

(54) CHIP PACKAGE STRUCTURE AND CHIP PACKAGE STRUCTURE ARRAY

(71) Applicant: Shanghai Zhaoxin Semiconductor Co., Ltd., Shanghai (CN)

(72) Inventors: Wen-Yuan Chang, New Taipei (TW); Yeh-Chi Hsu, New Taipei (TW); Hsueh-Chung Shelton Lu, New Taipei (TW); Wei-Cheng Chen, New Taipei (TW)

(73) Assignee: Shanghai Zhaoxin Semiconductor Co., Ltd., Shanghai (CN)

( * ) Notice: Subject to any disclaimer, the term of this patent is extended or adjusted under 35 U.S.C. 154(b) by 0 days.

(21) Appl. No.: 15/842,822

(22) Filed: Dec. 14, 2017

(65) Prior Publication Data
US 2019/0139898 A1    May 9, 2019

(30) Foreign Application Priority Data
Nov. 9, 2017 (TW) .............................. 106138745 A (51) Int. Cl.
*H01L 23/495* (2006.01)
*H01L 23/538* (2006.01)
(Continued)

(52) U.S. Cl.
CPC .......... *H01L 23/5389* (2013.01); *H01L 23/16* (2013.01); *H01L 23/3114* (2013.01);
(Continued)

(58) Field of Classification Search
CPC ............. H01L 23/3114; H01L 23/5386; H01L 23/5383; H01L 23/16; H01L 23/36;
(Continued)

(56) References Cited

U.S. PATENT DOCUMENTS 7,402,901 B2 * 7/2008 Hatano ............... H01L 23/5389
257/684
8,619,431 B2 * 12/2013 Lin .................... H01L 23/49816
361/761

(Continued)

FOREIGN PATENT DOCUMENTS

| CN | 102543973 | 7/2012 |
| CN | 107301956 | 10/2017 |

(Continued)

OTHER PUBLICATIONS

"Office Action of Taiwan Counterpart Application", dated Apr. 27, 2018, p. 1-p. 11.

(Continued)

*Primary Examiner* — Luan C Thai
(74) *Attorney, Agent, or Firm* — JCIPRNET (57) ABSTRACT

A chip package structure includes a plurality of first chips, a plurality of first conductive pillars, a second chip, a plurality of second conductive pillars, an encapsulated material and a redistribution structure. Each first chip has a first active surface. Each of the first conductive pillars is disposed on the first active surface of the corresponding first chip. A second active surface of the second chip is electrically connected to the first active surfaces of the first chips through the second conductive pillars. The encapsulated material partially covers the first chips, the first conductive pillars, the second chip and the second conductive pillars. The redistribution structure is disposed on the encapsulated material and connects the first conductive pillars. A chip package structure array is also provided.

22 Claims, 6 Drawing Sheets

(51) Int. Cl.
*H01L 23/31* (2006.01)
*H01L 23/367* (2006.01)
*H01L 23/00* (2006.01)
*H01L 23/16* (2006.01)
*H01L 25/065* (2006.01)
*H01L 23/36* (2006.01)
*H01L 23/498* (2006.01)

(52) U.S. Cl.
CPC ............ *H01L 23/36* (2013.01); *H01L 23/367* (2013.01); *H01L 23/5383* (2013.01); *H01L 23/5386* (2013.01); *H01L 23/562* (2013.01); *H01L 24/20* (2013.01); *H01L 24/97* (2013.01); *H01L 25/0652* (2013.01); *H01L 23/49816* (2013.01); *H01L 2224/16145* (2013.01); *H01L 2224/18* (2013.01); *H01L 2224/214* (2013.01); *H01L 2224/73209* (2013.01); *H01L 2224/73267* (2013.01); *H01L 2924/181* (2013.01); *H01L 2924/3511* (2013.01)

(58) Field of Classification Search
CPC . H01L 23/367; H01L 23/562; H01L 23/5389; H01L 24/20; H01L 24/97; H01L 25/0652
USPC ......................................................... 257/668
See application file for complete search history.

(56) References Cited

U.S. PATENT DOCUMENTS

| | | | |
|---|---|---|---|
| 9,171,816 B2* | 10/2015 | Teh | H01L 24/19 |
| 9,263,370 B2* | 2/2016 | Shenoy | H01L 23/5381 |
| 9,379,090 B1* | 6/2016 | Syed | H01L 25/0655 |
| 9,524,959 B1* | 12/2016 | Yeh | H01L 25/50 |
| 9,653,428 B1* | 5/2017 | Hiner | H01L 25/0655 |
| 9,666,559 B2* | 5/2017 | Wang | H01L 25/0655 |
| 9,761,559 B1* | 9/2017 | Shih | H01L 25/0652 |
| 2012/0049360 A1 | 3/2012 | Lai et al. | |
| 2013/0075903 A1 | 3/2013 | Pagaila et al. | |
| 2015/0364422 A1* | 12/2015 | Zhai | H01L 21/768 257/773 |

FOREIGN PATENT DOCUMENTS

| | | |
|---|---|---|
| TW | 560698 | 11/2003 |
| TW | 201715674 | 5/2017 |
| TW | 201715681 | 5/2017 |
| TW | 201721828 | 6/2017 |
| WO | 2016036667 | 3/2016 |

OTHER PUBLICATIONS

"Office Action of Taiwan Related Application, application No. 106138744", dated Feb. 23, 2018, p. 1-p. 6.

* cited by examiner

CHIP PACKAGE STRUCTURE AND CHIP PACKAGE STRUCTURE ARRAY

CROSS-REFERENCE TO RELATED APPLICATION

This application claims the priority benefit of Taiwan application serial no. 106138745, filed on Nov. 9, 2017. The entirety of the above-mentioned patent application is hereby incorporated by reference herein and made a part of this specification.

BACKGROUND

Field of the Disclosure

The invention relates to a chip package structure and a chip package structure array.

Description of Related Art

In chip packaging technology, one of the packaging methods is to mount the IC chip on a circuit substrate, and the circuit substrate is electrically connected to the electronic components in the next layer, such as motherboard or module board, etc. According to actual requirements, a plurality of chips are mounted on the same circuit substrate and form a multi-chip package structure, and the chips transmit signals to each other through circuit substrate. However, the line width and the line pitch of the circuit substrate are currently unable to meet the requirements of transmitting signals between multiple chips.

SUMMARY

The invention provides a chip package structure capable of satisfying the requirements of transmitting signals between multiple chips.

The invention provides a chip package structure array capable of cutting into a plurality of chip package structures, and each one of the chip package structures satisfies the requirement of transmitting signal between a plurality of chips.

The chip package structure of the invention includes a plurality of first chip, a plurality of first conductive pillars, a second chip, a plurality of second conductive pillars, an encapsulated material and a redistribution structure. Each first chip has a first active surface. Each of the first conductive pillars is disposed on a first active surface of the corresponding first chip. A second chip has a second active surface. The second active surface of the second chip is electrically connected to the first active surfaces of the first chips through the second conductive pillars. The encapsulated material covers the first chips, the first conductive pillars, the second chip and the second conductive pillars. The redistribution structure is disposed on the encapsulated material and connects with the first conductive pillars.

The invention provides a chip package structure array, including a plurality of chip package structures. The chip package structures are adapted to be arranged in array and form the chip package structure array. Each of the chip package structures includes a plurality of first chip, a plurality of first conductive pillars, a second chip, a plurality of second conductive pillars, an encapsulated material and a redistribution structure. Each of the first chips has a first active surface. Each of the first conductive pillars is disposed on a first active surface of the corresponding first chip. A second chip has a second active surface. The second active surface of the second chip is electrically connected to the first active surfaces of the first chips through the second conductive pillars. The encapsulated material covers the first chips, the first conductive pillars, the second chip and the second conductive pillars. The redistribution structure is disposed on the encapsulated material and connects with the first conductive pillars.

Based on the above, in the invention, a chip is electrically connected to at least other two chips in a face to face manner, so as to provide connection paths with greater density and shorter lengths.

In order to make the aforementioned and other features and advantages of the disclosure more comprehensible, embodiments accompanying figures are described in detail belows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
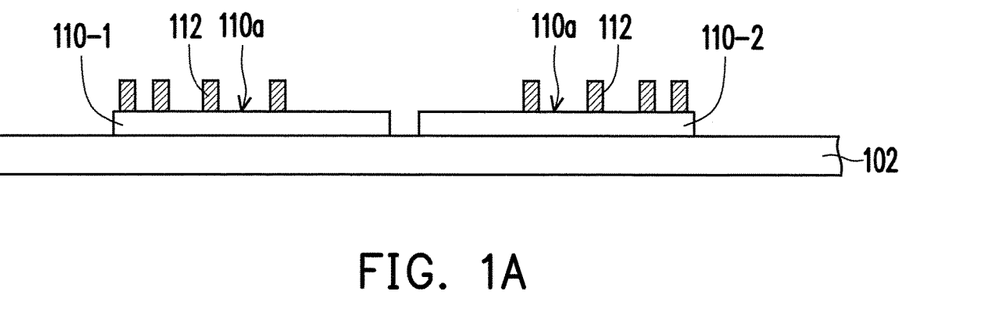
FIG. 1A to FIG. 1H are cross-sectional schematic views according to a chip packaging method of a one embodiment of the invention.

Referring to FIG. 1A, in the chip packaging method of the present embodiment, firstly, a plurality of first chips 110 (such as 110-1, 110-2) are disposed on a carrier 102. Each of the first chips 110 has a first active surface 110a, and a plurality of first conductive pillars 112 are disposed on the first active surface 110a. To be more specific, the first conductive pillars 112 are respectively disposed on a plurality of pads (not shown) of the first active surface 110a of the corresponding first chip 110.

Figure 1B:
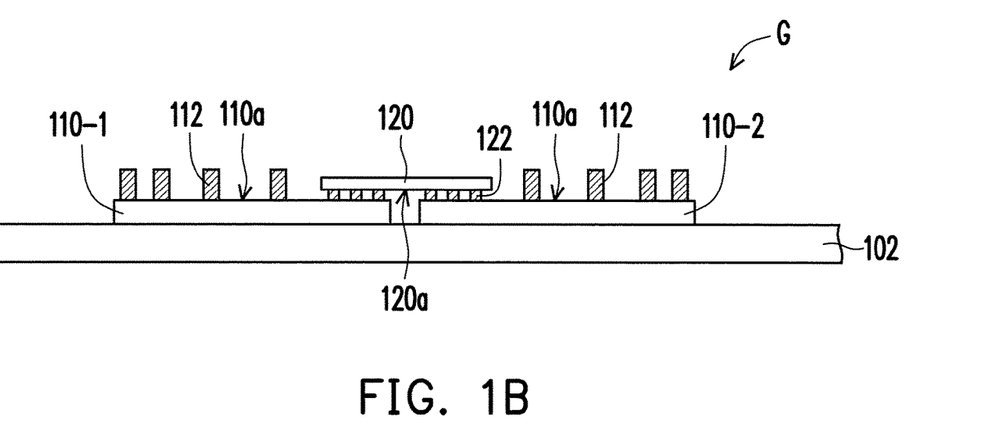

Referring to FIG. 1B, a second active surface 120a of a second chip 120 is electrically connected to the first active surfaces 110a of the first chips 110 through a plurality of second conductive pillars 122. To be more specific, a plurality of pads (not shown) of the second active surface 120a of the second chip 120 are electrically connected to a plurality of pads (not shown) of the first active surfaces 110a of the first chips 110 through the second conductive pillars 122. In the present embodiment, a part of the first active surface 110a of the first chip 110-1 and a part of the second active surface 120a of the second chip 120 are opposite each other, and an orthographic projection of the part of the first active surface 110a of the first chip 110-1 on the carrier 102 overlaps with an orthographic projection of the part of the second active surface 120a of the second chip 120. In the present embodiment, a part of the first active surface 110a of the first chip 110-2 and a part of the second active surface 120a of the second chip 120 are opposite each other, and an orthographic projection area of the part of the first active surface 110a of the first chip 110-1 on the carrier 102 overlaps with an orthographic projection of the part of the second active surface 120a of the second chip 120 on the carrier 102. Therefore, the first chip 110-1 and the first chip 110-2 are electrically connected to each other through the second conductive pillars 122 on the first chip 110-1, the second chip 120, the second conductive pillars 122 on the first chip 110-2, so as to provide connection paths with greater density and shorter length. In the present embodiment, a distribution density of the second conductive pillars 122 may be greater than a distribution density of the first conductive pillars 112. Otherwise, an orthographic projection area of the second conductive pillars 122 on the carrier 102 may not be greater than an orthographic projection area of the first conductive pillars 112 on the carrier 102. In addition, a height of the second conductive pillars 122 with respect to the first active surface 110a is not greater than a height of the first conductive pillars 112 with respect to the first active surface 110a.

Figure 1C:
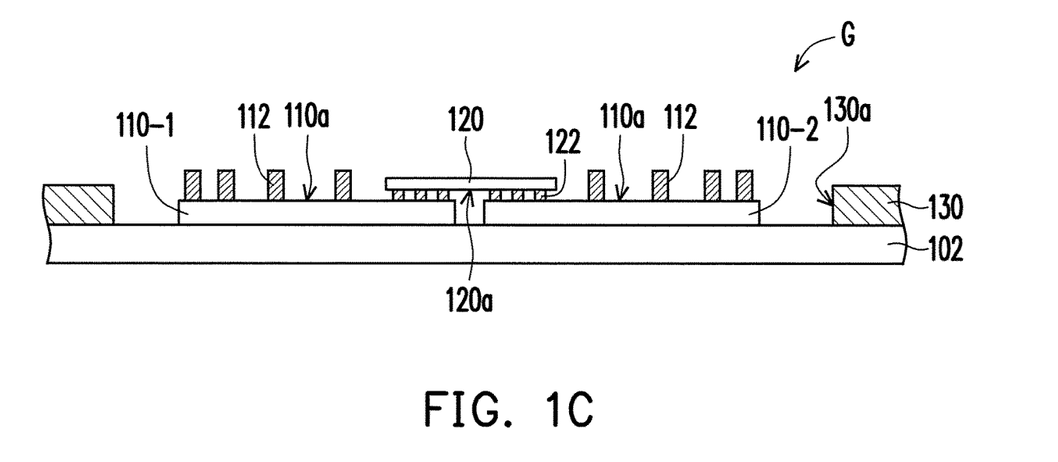

Referring to FIG. 1C, a supporting structure 130 is disposed on the carrier 102 and surrounds the first chips 110. In the present embodiment, the supporting structure 130 has an opening 130a encircling the first chips 110. The supporting structure 130 assists to improve the structural strength and reduce warpage level.

Figure 1D:
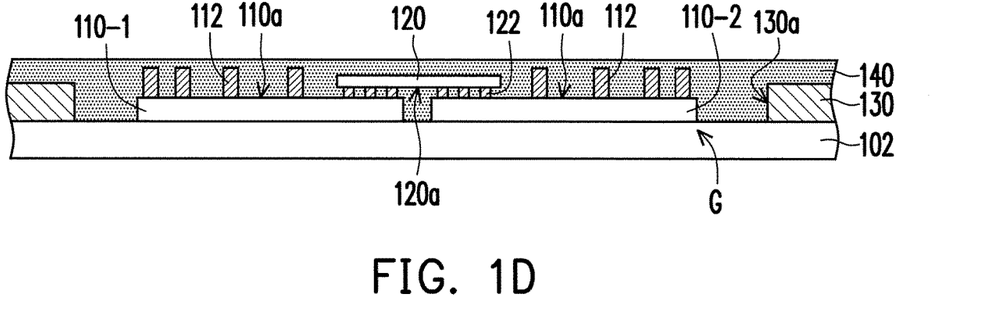

Referring to FIG. 1D, an encapsulated material 140, such as molding compound, is formed. The encapsulated material 140 partially covers the first chips 110, the first conductive pillars 112, the second chip 120, the second conductive pillars 122, and the supporting structure 130.

Figure 1E:
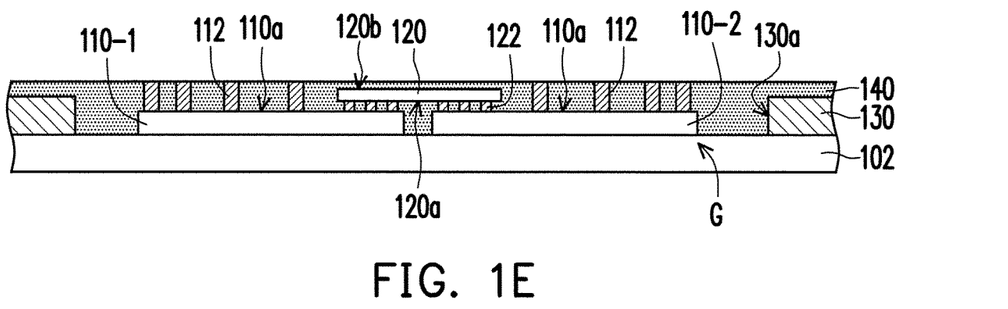

Referring to FIG. 1E, the encapsulated material 140 is partially removed to expose each of the first conductive pillars 112. In the present embodiment, the method of partially removing the encapsulated material 140 includes polishing. The encapsulated material 140 is kept to cover the second chip 120.

Figure 1F:
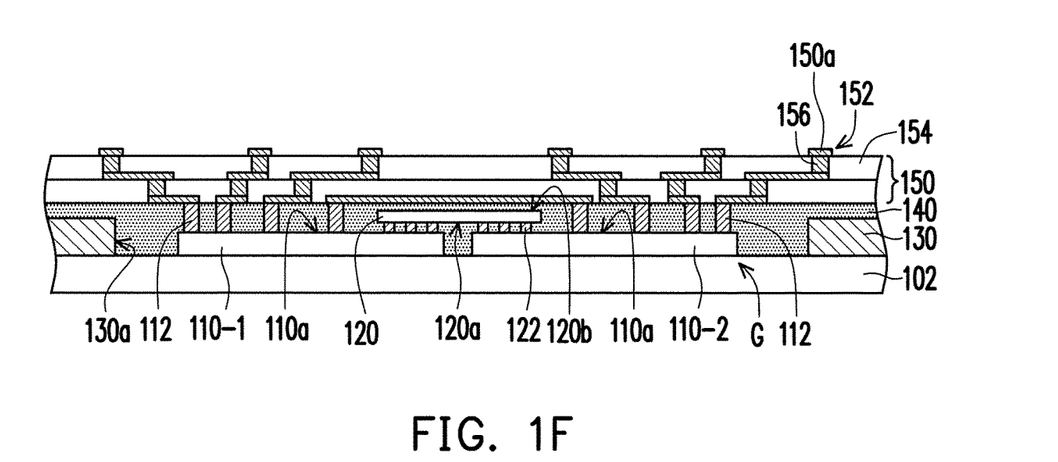

Referring to FIG. 1F, a redistribution structure 150 is formed on the encapsulated material 140 to redistribute the positions of output signals or input signals. In the present embodiment, the redistribution structure 150 includes a plurality of patterned conductive layers 152, a plurality of dielectric layers 154, and a plurality of conductive vias 156, wherein the dielectric layers 154 and the patterned conductive layers 152 are alternately stacked to one another, and each of the conductive vias 156 is located in the corresponding dielectric layer 154 and electrically connected to the corresponding patterned conductive layers 152. The first chips 110 may be electrically connected to each other not only through the second chip 120 but also through the redistribution structure 150. To be more specific, the first chip 110-1 and the first chip 110-2 are electrically connected to each other through the first conductive pillars 112 on the first chip 110-1, the patterned conductive layers 152 of the redistribution structure 150, and the first conductive pillars 112 on the first chip 110-2. Moreover, the first chip 110-1 and the first chip 110-2 may also be electrically connected to each other through the second conductive pillars 122 on the first chip 110-1, the second chip 120, and the second conductive pillars 122 on the first chip 110-2. In other words, there are at least two types of connection path between the first chip 110-1 and the first chip 110-2, as mentioned above.

Figure 1G:
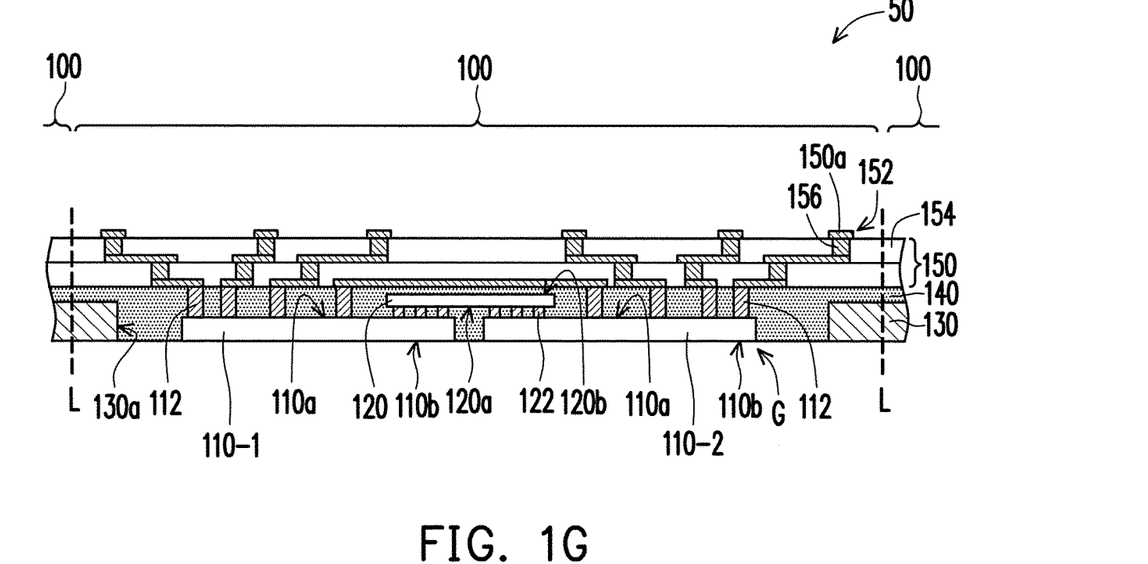

Referring to FIG. 1G, after forming the redistribution structure 150, the carrier 102 is removed, so as to expose first backside surfaces 110b of the first chips 110. At this time, the first backside surface 110b of the first chips 110, the exposed surface of the encapsulated material 140, and the supporting structure 130 are coplanar with each other.

Figure 1H:
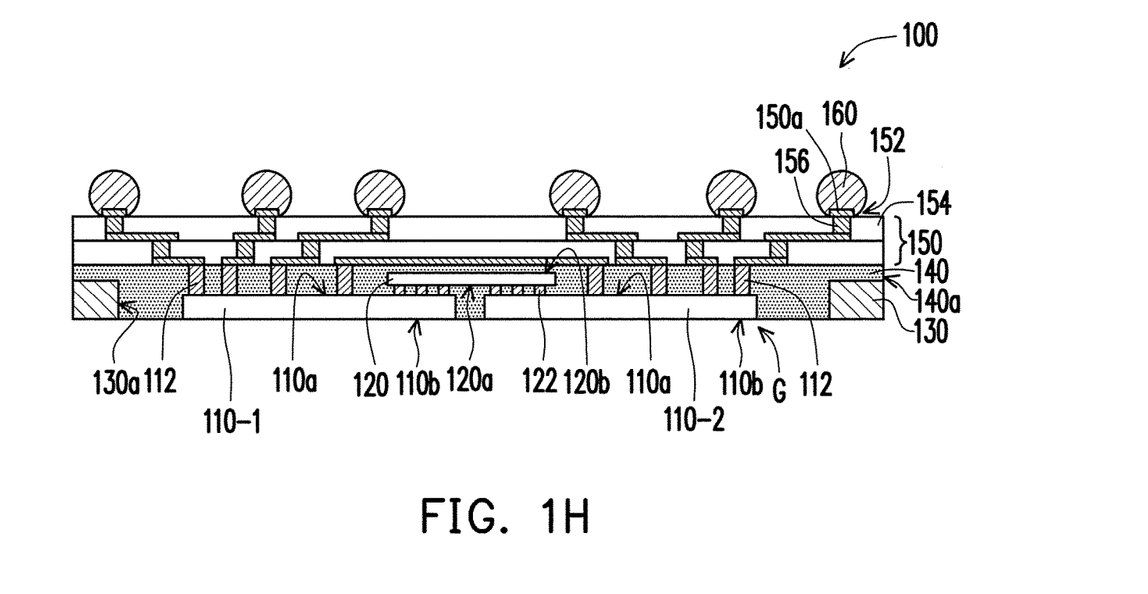

Referring to FIG. 1H, the redistribution structure 150 has a plurality of redistribution pads 150a which may be formed by the outermost patterned conductive layer 152. After removing the carrier 102 as shown in FIG. 1G, a conductive contact 160, such as solder ball, is formed on each of the redistribution pads 150a of the redistribution structure 150 to connect to an electronic component of next level, such as circuit board.

When a plurality of chip package structures 100 are produced in a batch, a plurality of first chips 110 and at least one of second chip 120 form a plurality of chip groups G (FIG. 1B shows only one group in the chip groups G) disposed on the carrier 102. Therefore, referring to FIG. 1G, before forming the conductive contacts 160, a singulation step may be performed, the redistribution structure 150, the encapsulated material 140, and the supporting structure 130 are cut along a cutting line L, so as to separate the chip groups G. At this time, the supporting structure 130 is exposed at a side surface 140a of the encapsulated material 140. Therefore, each of the chip package structures 100 includes one chip group G, the redistribution structure 150 (such as a part of the redistribution structure 150 after cutting), and the encapsulated material 140 (such as a part of the encapsulated material 140 after cutting).

Figure 2:
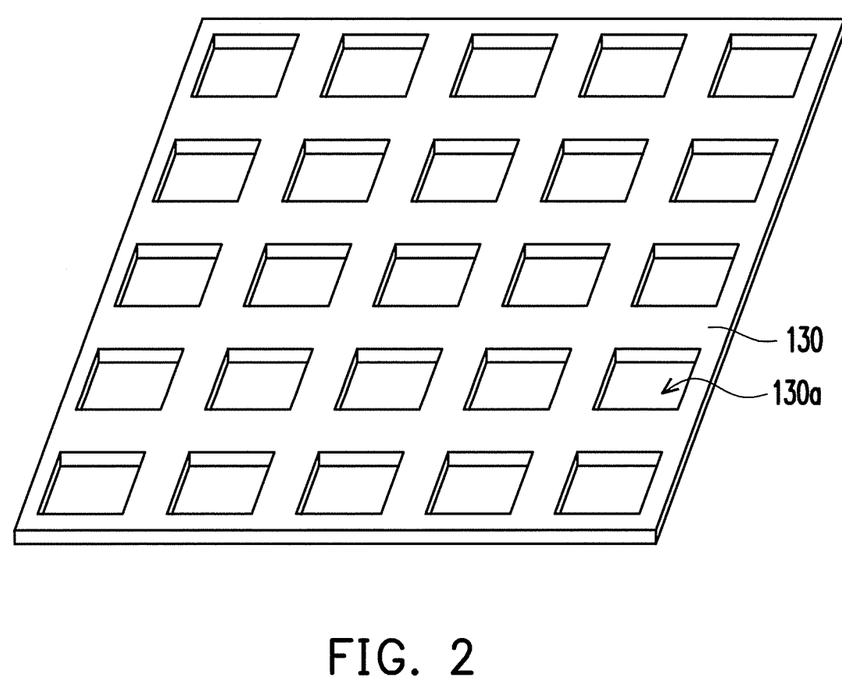
FIG. 2 is a three-dimensional view of a supporting structure in FIG. 1C including a plurality of openings.

Similarly, when a plurality of chip package structures 100 are produced in a batch, the supporting structure 130 has a plurality of openings 130a arranged in array. As shown in FIG. 2, each of the openings 130a surrounds the corresponding chip group G shown in FIG. 1C. Therefore, as shown in FIG. 1H, each of the chip package structures 100 includes the supporting structure 130 (such as a part of the supporting structure 130 after cutting).

In the present embodiment, a plurality of chip package structures 100, which is arranged in array and is not cut yet, may form a chip package structure array 50, as shown in FIG. 1G. In other words, the chip package structure array 50 includes a plurality of chip package structures 100 arranged in array and not cut yet. To be more specific, each of the chip package structures 100 includes a plurality of first chip 110 (such as 110-1 and 110-2), a plurality of first conductive pillars 112, a second chip 120, a plurality of second conductive pillars 122, an encapsulated material 140 and a redistribution structure 150. Each first chip 110 (such as 110-1 or 110-2) has a first active surface 110a. Each of the first conductive pillars 112 is disposed on the first active surface 110a of the corresponding first chip 110. The second chip 120 has a second active surface 120a. The second active surface 120a of the second chip 120 is electrically connected to the first active surfaces 110a of the first chips 110 through the second conductive pillars 122. The encapsulated material 140 partially covers the first chips 110, the first conductive pillars 112, the second chip 120, and the second conductive pillars 122. The redistribution structure 150 is disposed on the encapsulated material 140 and connects with the first conductive pillars 112.

When a supporting structure 130 (shown in FIG. 2) is disposed at the peripheral area of each of the chip package structures 100 of the chip package structure array 50, warpages generated in the process of packaging the chip package structure array 50 may be effectively reduced, so as to improve structural strength of the chip package structure array 50, and to reduce cost in the manufacturing process, in order to increase production yield of the chip package structure 100.

Figure 4:
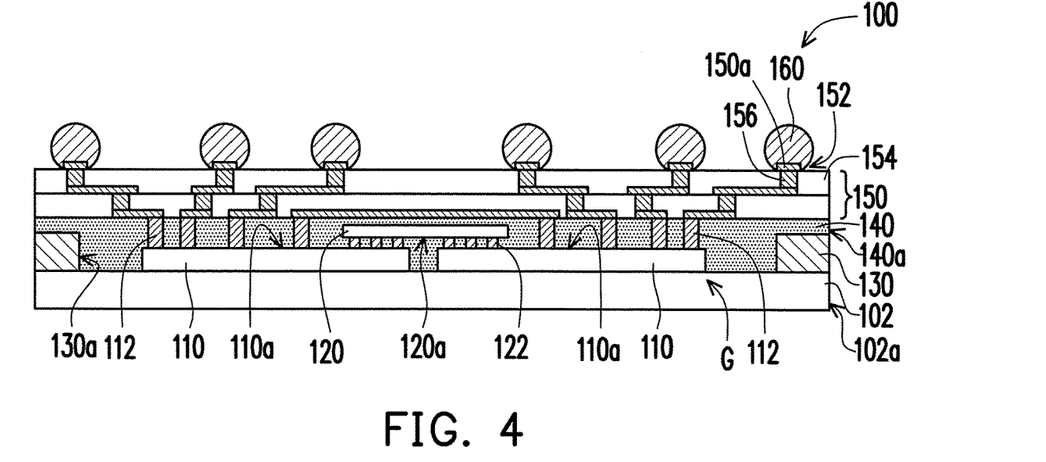
FIG. 4 is a cross-sectional schematic view according to a chip package structure of another embodiment of the invention.

FIG. 4 shows another embodiment of the invention. In comparison with the embodiment shown in FIGS. 1A to 1H, when the carrier 102 is made of heat dissipation material, the chip package structure 100 being completely packaged may keep the carrier 102 in FIG. 1F (such as a part of the carrier 102 after cutting) to serve as a heat dissipation element. At this time, the supporting structure 130 is exposed at a side surface 140a of the encapsulated material 140 and a side surface 102a of the carrier 102.

Figure 5:
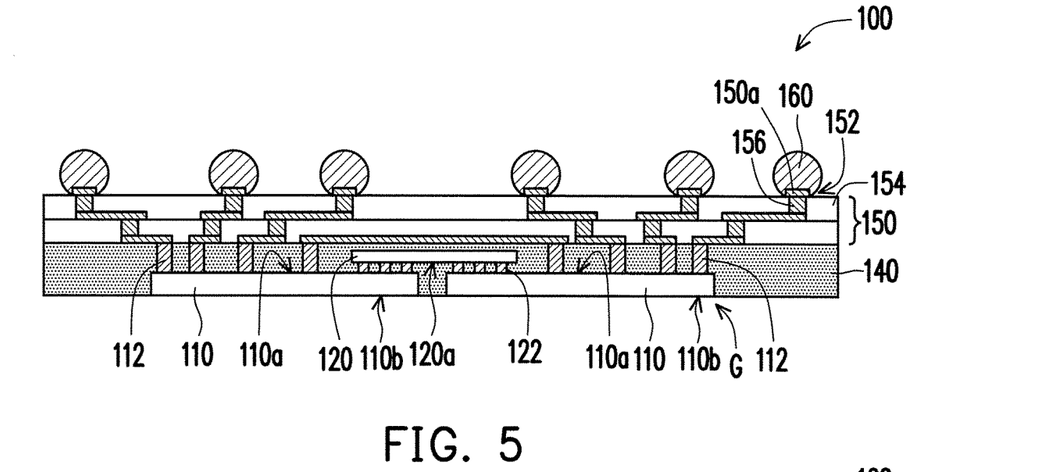
FIG. 5 is a cross-sectional schematic view according to a chip package structure of another embodiment of the invention.

In another embodiment shown in FIG. 5, compared to the embodiment shown in FIG. 1A to 1H, the supporting structure 130 may be omitted so that the chip package structure 100 after being completed does not include the supporting structure 130 in FIG. 1H.

Figure 6:
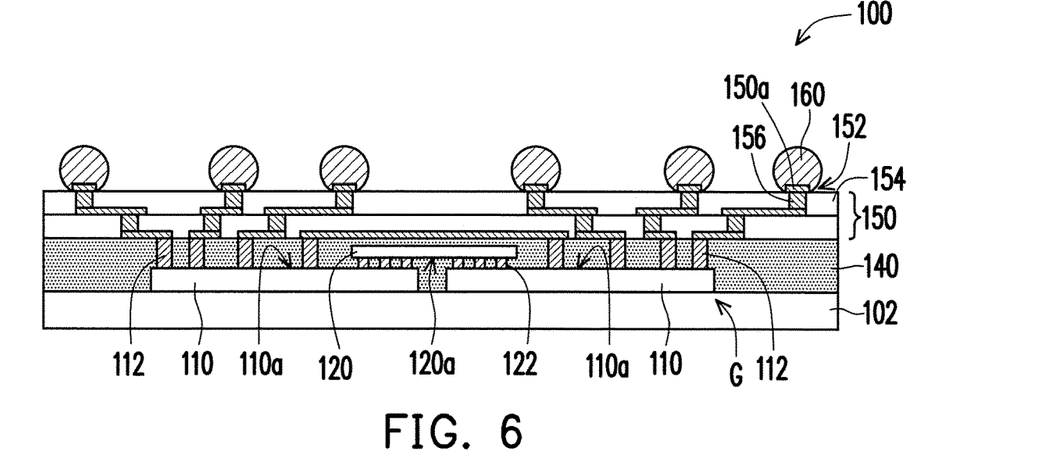
FIG. 6 is a cross-sectional schematic view according to a chip package structure of another embodiment of the invention.

FIG. 6. shows another embodiment of the invention. In comparison with the embodiment shown in FIGS. 1A to 1H, the supporting structure 130 in FIG. 1C may be omitted but the carrier 102 in FIG. 1F may be kept so that the chip package structure 100 after completely packaged does not include the supporting structure 130 but include the carrier 102 in FIG. 1F (such as a part of the carrier 102 after cutting) serving as a heat dissipation element.

The variations of the chip package structure 100 in FIGS. 4 to 6 may be applied to the chip package structure array 50 shown in FIG. 1G. For example, before the chip package structure array 50 being cutting, it may also include the carrier 102 as shown in FIGS. 4 and 6, and the carrier 102 may serve as a heat dissipation element. Moreover, before the chip package structure array 50 being cutting, it may also include the non-cutting supporting structure 130, as shown in FIG. 5.

Referring back to the embodiment in FIG. 1H, the chip package structure 100 includes a plurality of first chip 110 (such as 110-1 and 110-2), a plurality of first conductive pillars 112, a second chip 120, a plurality of second conductive pillars 122, an encapsulated material 140 and a redistribution structure 150. Each of the first chips 110 has a first active surface 110a, and each of the first conductive pillars 112 is disposed on the first active surface 110a of the corresponding first chip 110. The second chip 120 has a second active surface 120a. In the present embodiment, a part of the first active surface 110a of the first chip 110-1 and a part of the second active surface 120a of the second chip 120 are opposite each other, and an orthographic projection of the part of the first active surface 110a of the first chip 110-1 on the first backside surface 110b of the first chip 110-1 overlaps with an orthographic projection of the part of the second active surface 120a of the second chip 120 on the first backside surface 110b of the first chip 110-1. In the present embodiment, a part of the first active surface 110a of the first chip 110-2 and a part of the second active surface 120a of the second chip 120 are opposite each other, and an orthographic projection of the part of the first active surface 110a of the first chip 110-2 on the first backside surface 110b of the first chip 110-2 overlaps with an orthographic projection of the part of the second active surface 120a of the second chip 120 on the first backside surface 110b of the first chip 110-2.

The second active surface 120a of the second chip 120 is electrically connected to the first active surfaces 110a of the first chips 110 (such as 110-1 and 110-2) through the second conductive pillars 122. The encapsulated material 140 partially covers the first chips 110, the first conductive pillars 112, the second chip 120, and the second conductive pillars 122. The redistribution structure 150 is disposed on the encapsulated material 140 and connects with the first conductive pillars 112.

In the embodiment of FIG. 1H, the distribution density of the second conductive pillars 122 may be greater than the distribution density of the first conductive pillars 112. Otherwise, an orthographic projection area of the second conductive pillars 122 on the first chips 110 may not be greater than an orthographic projection area of the first conductive pillars 112 on the first chips 110. In addition, the height of the second conductive pillars 122 with respect to the first active surface 110a is not greater than the height of the first conductive pillars 112 with respect to the first active surface 110a. A part of the encapsulated material 140 is located between the second chip 120 and the redistribution structure 150 and covers a second backside surface 120b of the second chip 120. The redistribution structure 150 includes a plurality of patterned conductive layers 152, a plurality of dielectric layers 154, and a plurality of conductive vias 156, the dielectric layers 154 and the patterned conductive layers 152 are alternately stacked to one another, and each of the conductive vias 156 is located in the corresponding dielectric layer 154 and electrically connected to the corresponding patterned conductive layers 152.

In the embodiment of FIG. 1H, the chip package structure 100 further includes a supporting structure 130. The supporting structure 130 surrounds the first chips 110 and is embedded in the encapsulated material 140. The supporting structure 130 is exposed at the side surface 140a of the encapsulated material 140.

In the embodiment of FIG. 1H, the chip package structure 100 further includes a plurality of conductive contacts 160, such as solder ball. The redistribution structure 150 has a plurality of redistribution pads 150a, and the conductive contacts 160 are respectively disposed on the redistribution pads 150a.

It should be noted here, the first chip 110-1 and the first chip 110-2 are electrically connected to each other through the first conductive pillars 112 on the first chip 110-1, the patterned conductive layers 152 of the redistribution structure 150, the first conductive pillars 112 on the first chip 110-2. Moreover, the first chip 110-1 and the first chip 110-2 are also electrically connected to each other through the second conductive pillars 122 on the first chip 110-1, the second chip 120, the second conductive pillars 122 on the first chip 110-2. In other words, there are at least two connection paths between the first chip 110-1 and the first chip 110-2.

Figure 3A:
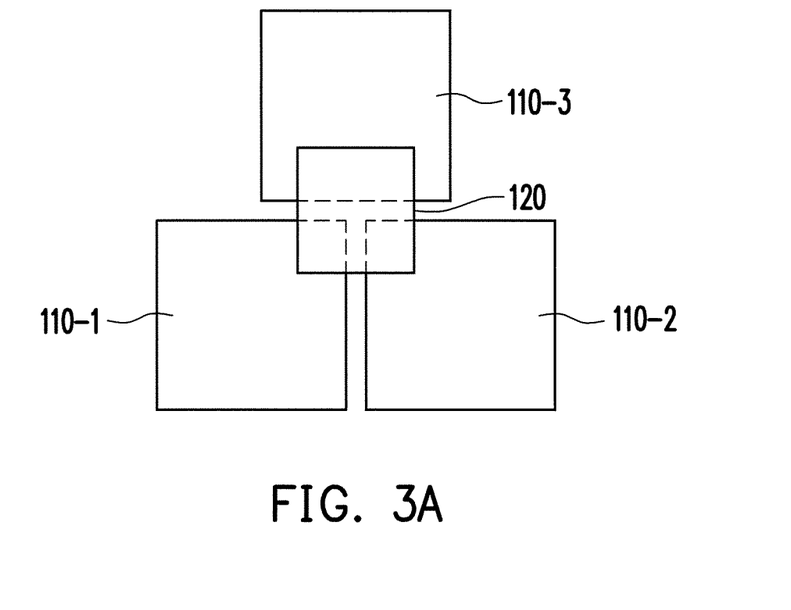
FIG. 3A is a top view of a plurality of first chips and a second chip according to another embodiment of the invention.
Figure 3B:
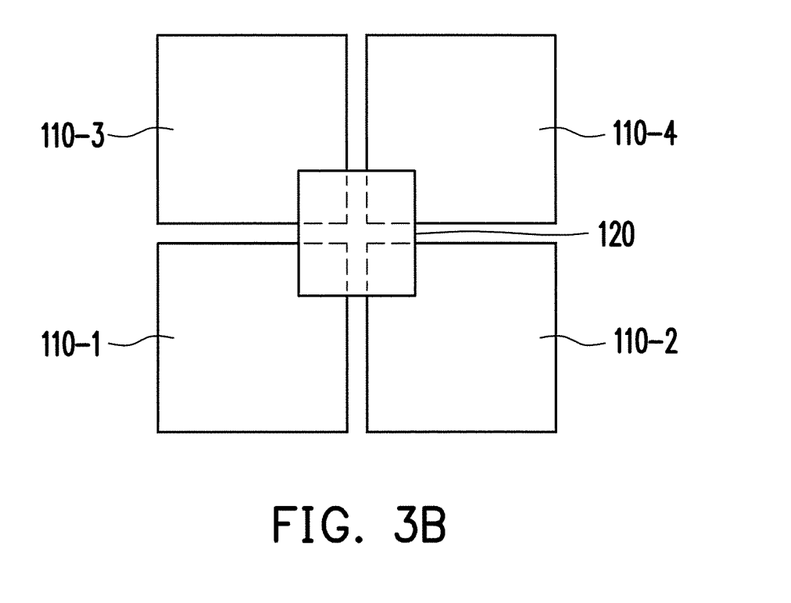
FIG. 3B is a top view of a plurality of first chips and a second chip according to another embodiment of the invention.

Moreover, one second chip 120 is connected to two first chips 110-1 and 110-2 in a face to face manner as described in the embodiments above, but the invention is not limited thereto. In other embodiments, one second chip 120 may also be connected to three first chips (such as 110-1, 110-2 and 110-3 shown in FIG. 3A) or four first chips (such as 110-1, 110-2, 110-3, and 110-4 shown in FIG. 3B), or even more than four first chips 110 depending to requirements in use.

In the embodiment of FIG. 4, in comparison with the embodiment in FIG. 1H, the chip package structure 100 further includes a carrier 102, wherein the material of the carrier 102 is heat dissipation material so that the carrier 102 may serve as a heat dissipation element. The first chips 110, the encapsulated material 140, and the supporting structure 130 are disposed on the carrier 102. The supporting structure 130 is exposed at the side surface 140a of the encapsulated material 140 and the side surface 102a of the carrier 102.

In the embodiment of FIG. 5, compared to the embodiment in FIG. 1H, the chip package structure 100 does not include the carrier 130 in FIG. 1H.

In the embodiment of FIG. 6, compared to the embodiment in FIG. 5, the chip package structure 100 further includes a carrier 102. The material of the carrier 102 is heat dissipation material so the carrier 102 may serve as a heat dissipation element. The first chips 110 and the encapsulated material 140 are disposed on the carrier 102.

Summarily, in the invention, a chip is electrically connected to at least other two chips in a face to face manner, so as to provide connection paths with greater density and shorter length. In addition, the supporting structure may be added to assist in improving the structural strength and reducing warpage level. Otherwise, when the material of the carrier is heat dissipation material, the carrier may also be kept to serve as a heat dissipation element.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip package structure, comprising:
   a plurality of first chips, each of the first chips having a first active surface;
   a plurality of first conductive pillars, each of the first conductive pillars being disposed on the first active surface of the corresponding first chip;
   a second chip, having a second active surface, and the second chip is an one-side connect die;
   a plurality of second conductive pillars, each of the second conductive pillars is connected between the first active surface of the corresponding first chip and the second active surface of the corresponding second chip, the second chip is electrically connected to the first active surfaces of the first chips only through the second conductive pillars, and a height of the first conductive pillars with respect to the first active surface is larger than a height of the second chip and the second conductive pillars with respect to the first active surface;
   an encapsulated material, covering the first chips, the second chip and the second conductive pillars, and partially covering the first conductive pillars; and
   a redistribution structure, disposed on the encapsulated material and connecting with the first conductive pillars, wherein a part of the encapsulated material is located between the second chip and the redistribution structure.

2. The chip package structure as recited in claim 1, wherein a distribution density of the second conductive pillars is greater than a distribution density of the first conductive pillars.

3. The chip package structure as recited in claim 1, wherein an orthographic projection area of the second conductive pillars on the first chips is less than or equal to an orthographic projection area of the first conductive pillars on the first chips.

4. The chip package structure as recited in claim 1, wherein a height of the second conductive pillars with respect to the first active surface is less than or equal to a height of the first conductive pillars with respect to the first active surface.

5. The chip package structure as recited in claim 1, wherein the first chips are electrically connected to each other through the redistribution structure.

6. The chip package structure as recited in claim 1, further comprising:
   a carrier, wherein the carrier is made of a heat dissipation material and serves as a heat dissipation element, and the first chips and the encapsulated material are disposed on the carrier.

7. The chip package structure as recited in claim 1, further comprising:
   a supporting structure, surrounding the first chips and embedded in the encapsulated material, and a part of the encapsulated material is located between the supporting structure and the redistribution structure.

8. The chip package structure as recited in claim 7, wherein the supporting structure is exposed at one side of the encapsulated material.

9. The chip package structure as recited in claim 7, further comprising:
   a carrier, wherein the carrier is made of a heat dissipation material and serves as a heat dissipation element, and the first chips, the encapsulated material and the supporting structure are disposed on the carrier.

10. The chip package structure as recited in claim 9, wherein the supporting structure is exposed at one side of the encapsulated material and one side of the carder.

11. The chip package structure as recited in claim 1, wherein the redistribution structure comprises a plurality of patterned conductive layers, a plurality of dielectric layers, and a plurality of conductive vias, wherein the plurality of dielectric layers and the patterned conductive layers are alternately stacked to one another, and each of the conductive vias is located in the corresponding dielectric layer and electrically connected to the corresponding patterned conductive layers.

12. The chip package structure as recited in claim 1, further comprising:
   a plurality of conductive contacts, wherein the redistribution structure has a plurality of redistribution pads, and the conductive contacts are respectively disposed on the redistribution pads.

13. A chip package structure array, comprising:
   a plurality of chip package structures, adapted to be arranged in array and form the chip package structure array, each of the chip package structures comprises:
   a plurality of first chips, each of the first chips having a first active surface;
   a plurality of first conductive pillars, each of the first conductive pillars being disposed on the first active surface of the corresponding first chip;
   a second chip, having a second active surface, and the second chip is an one-side connect die;
   a plurality of second conductive pillars, each of the second conductive pillars is connected between the first active surface of the corresponding first chip and the second active surface of the corresponding second chip, the second chip is electrically connected to the first active surfaces of the first chips only through the second conductive pillars, and a height of the first conductive pillars with respect to the first active surface is larger than a height of the second chip and the second conductive pillars with respect to the first active surface;
   an encapsulated material, covering the first chips, the second chip and the second conductive pillars, and partially covering the first conductive pillars; and a redistribution structure, disposed on the encapsulated material and connecting with the first conductive pillars, wherein a part of the encapsulated material is located between the second chip and the redistribution structure.

14. The chip package structure array as recited in claim 13, wherein a distribution density of the second conductive pillars is greater than a distribution density of the first conductive pillars.

15. The chip package structure array as recited in claim 13, wherein an orthographic projection area of the second conductive pillars on the first chips is less than or equal to an orthographic projection area of the first conductive pillars on the first chips.

16. The chip package structure array as recited in claim 13, wherein a height of the second conductive pillars with respect to the first active surface is less than or equal to a height of the first conductive pillars with respect to the first active surface.

17. The chip package structure array as recited in claim 13, wherein the first chips are electrically connected to each other through the redistribution structure.

18. The chip package structure array as recited in claim 13, wherein the chip package structure further comprises:
a carrier, wherein the carrier is made of a heat dissipation material and serves as a heat dissipation element, and the first chips and the encapsulated material are disposed on the carrier.

19. The chip package structure array as recited in claim 13, wherein the chip package structure further comprises:
a supporting structure, surrounding the first chips and embedded in the encapsulated material, and a part of the encapsulated material is located between the supporting structure and the redistribution structure.

20. The chip package structure array as recited in claim 19, wherein the chip package structure further comprises:
a carrier, wherein the carrier is made of a heat dissipation material and serves as a heat dissipation element, and the first chips, the encapsulated material and the supporting structure are disposed on the carrier.

21. The chip package structure array as recited in claim 13, wherein the redistribution structure comprises a plurality of patterned conductive layers, a plurality of dielectric layers, and a plurality of conductive vias, wherein the dielectric layers and the patterned conductive layers are alternately stacked to one another, and each of the conductive vias is located in the corresponding dielectric layer and electrically connected to the corresponding patterned conductive layers.

22. The chip package structure array as recited in claim 13, wherein the chip package structure further comprises:
a plurality of conductive contacts, wherein the redistribution structure has a plurality of redistribution pads, and the conductive contacts are respectively disposed on the redistribution pads.

* * * * *